(12) United States Patent
Kansaku

(10) Patent No.: US 11,632,050 B2
(45) Date of Patent: Apr. 18, 2023

(54) BROKEN WIRE PROTECTION FOR SEMICONDUCTOR PACKAGE OR DEVICE

(71) Applicant: ROHM Co., LTD., Kyoto (JP)

(72) Inventor: Kiyoshi Kansaku, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 170 days.

(21) Appl. No.: 17/147,634

(22) Filed: Jan. 13, 2021

(65) Prior Publication Data
US 2021/0217673 A1 Jul. 15, 2021

(30) Foreign Application Priority Data
Jan. 14, 2020 (JP) .............................. JP2020-003899

(51) Int. Cl.
*H02M 3/335* (2006.01)
*H02M 1/36* (2007.01)

(52) U.S. Cl.
CPC ......... *H02M 3/33569* (2013.01); *H02M 1/36* (2013.01)

(58) Field of Classification Search
CPC ......... H01L 23/562; H01L 23/34; H02M 1/36
See application file for complete search history.

(56) References Cited

U.S. PATENT DOCUMENTS

| | | | | |
|---|---|---|---|---|
| 5,945,883 A * | 8/1999 | Nagasawa | .............. | H03K 3/011 331/177 R |
| 2005/0018453 A1* | 1/2005 | Wofford | .................. | H02M 1/32 363/41 |
| 2005/0088212 A1* | 4/2005 | Leith | ..................... | H02M 3/156 327/198 |
| 2012/0206031 A1* | 8/2012 | Hiroki | ................... | H01L 51/529 313/504 |
| 2019/0393697 A1* | 12/2019 | Jordanger | .......... | H03K 17/0822 |
| 2020/0058603 A1* | 2/2020 | Ahn | ........................ | H02H 9/046 |
| 2022/0149835 A1* | 5/2022 | Warnes | ................ | H03K 17/567 |

FOREIGN PATENT DOCUMENTS

JP 2005277338 10/2005

* cited by examiner

*Primary Examiner* — Peter M Novak
(74) *Attorney, Agent, or Firm* — Chip Law Group

(57) ABSTRACT

Disclosed herein is a semiconductor device configured by packaging a semiconductor chip, including at least one terminal. The semiconductor chip includes a pad connected to the terminal, a voltage clamp unit, and a wiring disposed along an outer periphery of the semiconductor chip and between the voltage clamp unit and the pad. In a case in which the wiring has no broken wire portion, a terminal voltage generated at the terminal is clamped to a clamp voltage by the voltage clamp unit, and in a case in which the wiring has a broken wire portion, the terminal voltage reaches a predetermined voltage higher than the clamp voltage or a predetermined voltage lower than the clamp voltage.

10 Claims, 5 Drawing Sheets

BROKEN WIRE PROTECTION FOR SEMICONDUCTOR PACKAGE OR DEVICE

CROSS REFERENCE TO RELATED APPLICATIONS

This application claims priority benefit of Japanese Patent Application No. JP 2020-003899 filed in the Japan Patent Office on Jan. 14, 2020. Each of the above-referenced applications is hereby incorporated herein by reference in its entirety.

BACKGROUND

The present disclosure relates to a semiconductor device.

A process used to manufacture a semiconductor device is called dicing in which a semiconductor wafer having circuits formed therein is cut and separated into semiconductor chips. In the past, the dicing has sometimes caused a defect called chipping, i.e., chipping that occurs in a semiconductor chip.

A semiconductor device capable of detecting such chipping has been disclosed, for example, in Japanese Patent Laid-Open No. 2005-277338. The semiconductor chip disclosed in Japanese Patent Laid-Open No. 2005-277338 has a configuration in which an inspection wiring is formed at at least a part of the periphery of the semiconductor chip, with both ends of the inspection wiring being connected to pads of the semiconductor chip. Then, the semiconductor chip is packaged to manufacture a semiconductor device.

SUMMARY

With the semiconductor device of Japanese Patent Laid-Open No. 2005-277338 described above, chipping is detected as follows: During sorting of the semiconductor device after the packaging, an inspection apparatus such as a resistance measuring instrument is made in contact with the two pads to which both ends of the inspection wiring are connected, thereby measuring the resistance of the inspection wiring to detect the presence of chipping. It is considered that the two pads described above are connected to terminals of the package when assembling the package and that the inspection apparatus is in contact with the terminals. This configuration additionally requires such two terminals used only for the inspection, which poses a problem of an increase in the number of the terminals.

In view of the aforementioned situation in the related art, the present disclosure provides a semiconductor device capable of detecting chipping thereof while avoiding an increase in the number of terminals.

Aiming at achieving the desire described above, a semiconductor device according to an example of the present disclosure is configured by packaging a semiconductor chip and includes at least one terminal. The semiconductor chip includes a pad connected to the terminal, a voltage clamp unit, and a wiring disposed along an outer periphery of the semiconductor chip and between the voltage clamp unit and the pad, in which, in a case in which the wiring has no broken wire portion, a terminal voltage generated at the terminal is clamped to a clamp voltage by the voltage clamp unit, and in a case in which the wiring has a broken wire portion, the terminal voltage reaches a predetermined voltage higher than the clamp voltage or a predetermined voltage lower than the clamp voltage (first configuration).

Moreover, in the first configuration described above, the terminal may be connectable to an external capacitor, the semiconductor chip may include a constant current source configured to cause a current to flow into the pad, and the voltage clamp unit may include a first p-channel metal-oxide semiconductor (PMOS) transistor having a source connected to the pad via the wiring. (second configuration).

Moreover, in the second configuration described above, the constant current source may be a current mirror which uses a reference voltage as a power source and includes a second PMOS transistor and a third PMOS transistor (third configuration).

Moreover, in the second or third configuration described above, the voltage clamp unit may include voltage dividing resistors configured to divide a reference voltage into a sub-voltage applied to a gate of the first PMOS transistor (fourth configuration).

Moreover, in any one of the second to fourth configurations described above, the terminal voltage may be a voltage to be used in a soft start operation fed to an error amplifier included in the semiconductor chip (fifth configuration).

Moreover, in any one of the first to fifth configurations described above, the semiconductor chip may include a semiconductor substrate, and a plurality of metal layers disposed on the semiconductor substrate, and the wiring may be formed in at least one of the metal layers other than the outermost metal layer on an opposite side to a side of the semiconductor substrate, among the plurality of metal layers (sixth configuration).

Moreover, in any one of the first to fifth configurations described above, the semiconductor chip may include a semiconductor substrate and a plurality of metal layers disposed on the semiconductor substrate, and the wiring may be formed in all of the metal layers (seventh configuration).

Moreover, the semiconductor device having any one of the configurations described above may be a power-supply controller configured to drive and control a switching power-supply circuit (eighth configuration).

Moreover, the semiconductor device having the eighth configuration may be for use in a vehicle (ninth configuration).

Moreover, a switching power-supply circuit according to another example of the present disclosure includes a semiconductor device having the eighth or ninth configurations.

With the semiconductor device according to an embodiment of the present disclosure, it is possible to detect chipping without an increase in the number of terminals.

DETAILED DESCRIPTION OF THE PREFERRED EMBODIMENT

Hereinafter, an embodiment of the present disclosure will be described with reference to the accompanying drawings.

<Chipping>

The manufacturing process of a semiconductor device includes a process, a generally-called dicing process, for cutting a semiconductor wafer in which integrated circuits (ICs) are formed. In the dicing process, a wafer is cut and separated into semiconductor chips with a disk-shaped cutting blade (blade), a laser beam, or any other tool. Unfortunately, a phenomenon called chipping may occur in which chipping occurs on an outer peripheral end surface of a semiconductor chip after dicing depending on factors including cutting performance of the blade, and dicing conditions in terms of a rotation speed of the blade, power of laser, or other factors. The chipping can cause water intrusion, for example, which leads to corrosion or any failure of the wiring formed of e.g., aluminum (Al), resulting in possible abnormal operation of the IC.

Moreover, even with a chipping within an allowable range immediately after the dicing process, there is also a possibility that the chipping develops greater in the subsequent process for packaging the semiconductor chip to manufacture the semiconductor device. The semiconductor device to be described below according to the embodiment of the present disclosure, is capable of detecting not only such a chipping immediately after dicing but also one that may occur in processes after the dicing.

<Configuration of DC/DC Converter>

Figure 1:
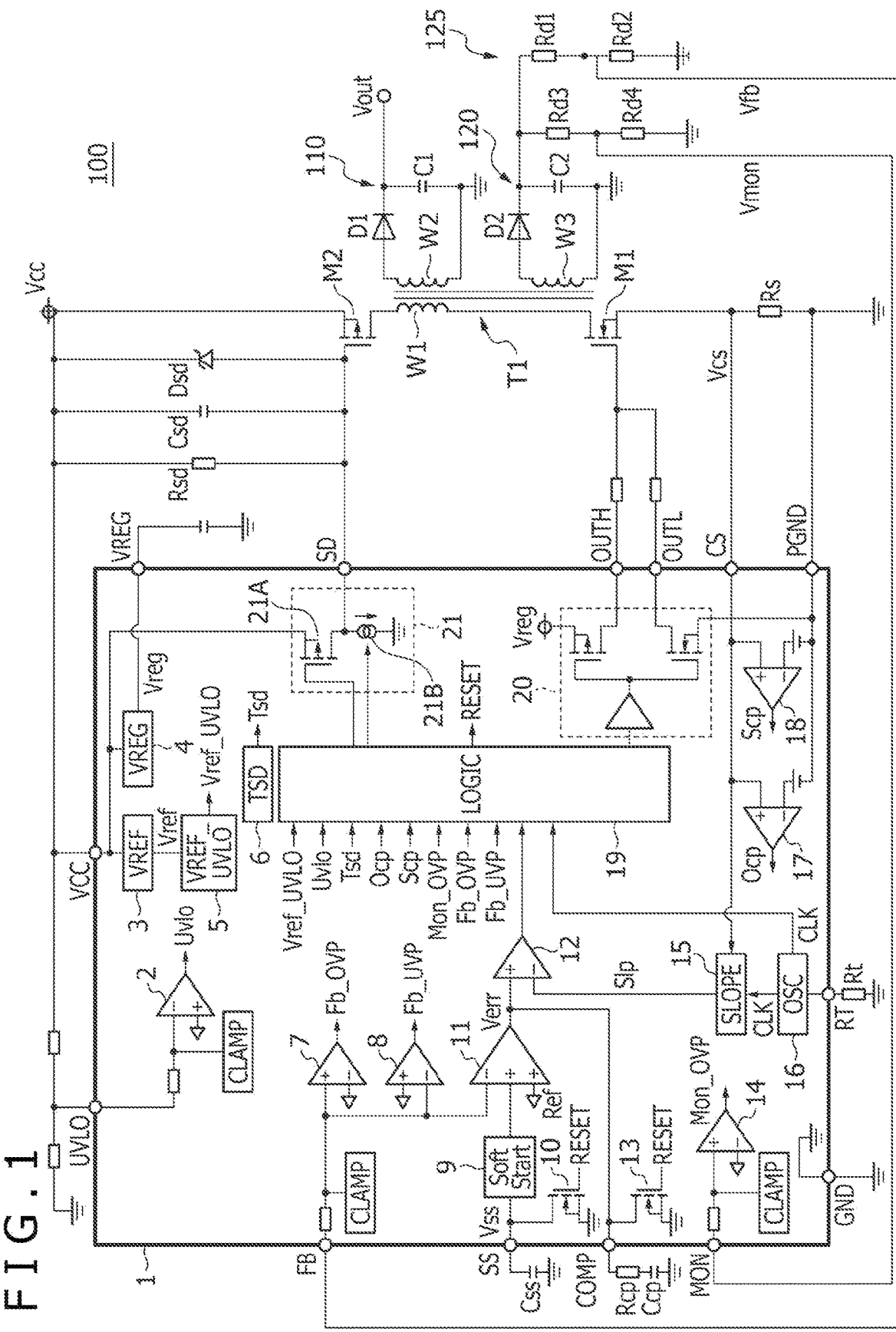
FIG. 1 is a circuit diagram illustrating a configuration of a direct current (DC)/DC converter according to an embodiment of the present disclosure.

FIG. 1 is a circuit diagram illustrating a configuration of a DC/DC converter 100 that includes a semiconductor device 1 according to an embodiment of the present disclosure. The DC/DC converter 100 depicted in FIG. 1 is an isolated switching power-supply circuit for use in vehicles which is configured as a flyback converter that boosts a power supply voltage Vcc as an input voltage, to generate an output voltage Vout.

The DC/DC converter 100 includes the semiconductor device 1 and elements which are discrete components disposed outside the semiconductor device 1.

A transformer T1 includes a primary winding W1 and a secondary winding W2. One end of the primary winding W1 is connected to a drain of a protection transistor M2 for shutdown that includes a PMOS transistor. A source of the protection transistor M2 has an application end of the power supply voltage Vcc connected thereto. The other end of the primary winding W1 is connected to a drain of a switching transistor M1 that includes an N-channel metal oxide semiconductor (NMOS) transistor. A source of the switching transistor M1 has one end of a detection resistor Rs for detecting a current connected thereto. The other end of the detection resistor Rs is connected to an application end of a ground potential.

The secondary winding W2 is connected to a rectifying-and-smoothing circuit 110 including a diode D1 and a capacitor C1. Through a switching operation of the switching transistor M1, the rectifying-and-smoothing circuit 110 outputs the output voltage Vout.

In addition, the transformer T1 includes an auxiliary winding W3 on a secondary side. The auxiliary winding W3 is connected to a rectifying-and-smoothing circuit 120 including a diode D2 and a capacitor C2. A feedback circuit 125 includes the rectifying-and-smoothing circuit 120 and voltage dividing resistors Rd1 and Rd2 for dividing a voltage. The voltage dividing resistors Rd1 and Rd2 divide the output voltage of the rectifying-and-smoothing circuit 120, which generates a feedback voltage Vfb according to the output voltage Vout.

FIG. 1 illustrates an internal block configuration of the semiconductor device 1. The semiconductor device 1 is configured by packaging a semiconductor chip including an internal circuit as an IC depicted in FIG. 1. The device is provided with package terminals (lead terminals) for making electrical connection to the outside, including a UVLO terminal, a VCC terminal, a VREG terminal, an SD terminal, an OUTH terminal, an OUTL terminal, a CS terminal, a PGND terminal, an RT terminal, a GND terminal, an MON terminal, a COMP terminal, an SS terminal, and an FB terminal.

The under voltage lock out (UVLO) terminal is applied with a voltage that is obtained by dividing the power supply voltage Vcc by resistance. When the voltage of the UVLO terminal falls to a predetermined threshold voltage Vuvlo1 or lower, a UVLO unit 2 outputs a signal Uvlo that causes the IC to be shut down. When the voltage of the UVLO terminal rises to a predetermined threshold voltage Vuvlo2 (>Vuvlo1) or higher, the UVLO unit 2 outputs a signal Uvlo that indicates the release of UVLO.

A reference voltage generator 3 generates a reference voltage Vref based on the power supply voltage Vcc applied to the VCC terminal. When the reference voltage Vref falls to a predetermined threshold or lower, a reference voltage UVLO unit 5 outputs a signal Vref_UVLO that causes the IC to be shut down.

An internal voltage generator 4 generates an internal voltage Vreg based on the power supply voltage Vcc.

When the temperature of the inside of the IC rises to a predetermined temperature or higher, a thermal shutdown (TSD) unit 6 outputs a signal Tsd that causes the IC to be shut down.

When the feedback voltage Vfb applied to the FB terminal rises to a predetermined voltage or higher, an output overvoltage protection unit 7 outputs a signal Fb_OVP that causes the voltage of the OUTL terminal to be forcibly fixed at "Low." When the feedback voltage Vfb falls to a predetermined voltage or lower, an output undervoltage protection unit 8 recognizes that an undervoltage is detected, and thus asserts a signal Fb_UVP.

An output overvoltage protection unit 14 asserts a signal Mon_OVP when a detection voltage Vmon rises to a predetermined voltage or higher, the Vmon being obtained by dividing the output voltage of the rectifying-and-smoothing circuit 120 by voltage dividing resistors Rd3 and Rd4. The output overvoltage protection unit 14 detects an output overvoltage that is caused in a case where a normal feedback voltage Vfb is not fed back to the FB terminal due to an abnormality in the voltage dividing resistors Rd1 and Rd2 used for the feedback.

A short circuit protection (SCP) unit 18 is a circuit to detect a short circuit between the drain and source of the switching transistor M1. While the switching transistor M1 is off, the SCP unit 18 compares a predetermined voltage with a current detection signal Vcs that is generated by the resistor Rs and applied to the CS terminal. Then, in a case where the current detection signal Vcs is determined to be equal to the predetermined voltage or higher, the SCP unit recognizes that the drain and source of the switching transistor M1 are short-circuited, and thus asserts a signal Scp.

When the current detection signal Vcs rises to a predetermined voltage or higher, an overcurrent protection unit 17 recognizes that an overcurrent is detected, and thus asserts a signal Ocp.

An inverting input terminal (−) of an error amplifier 11 is applied with the feedback voltage Vfb generated at the FB terminal. A first non-inverting input terminal (+) of the error amplifier 11 is applied with a soft-start voltage Vss generated by a soft-start circuit 9, and a second non-inverting input terminal (+) is applied with a predetermined reference voltage Ref.

The soft-start circuit 9 charges a capacitor Css externally connected to the SS terminal so as to generate, at the SS terminal, the soft-start voltage Vss that gradually rises as the charging proceeds. The soft-start voltage Vss allows the output voltage Vout to gently rise, thereby preventing the occurrence of an overshoot and inrush current of the output voltage Vout. Note that a detailed description of the soft-start circuit 9 will be made later.

The error amplifier 11 amplifies an error between the feedback voltage Vfb and the lower of the voltages (i.e., the soft-start voltage Vss and the reference voltage Ref) applied to the first and second non-inverting input terminals, and then outputs the resulting error signal Verr. To an output terminal of the error amplifier 11, a resistor Rcp and a capacitor Ccp which are for phase compensation are connected via the COMP terminal.

An oscillator 16 generates a clock signal CLK having a frequency according to a resistance of a resistor Rt connected to the RT terminal. The clock signal CLK is supplied to both a slope compensation unit 15 and a logic unit 19. The clock signal CLK defines the switching frequency.

The slope compensation unit 15 generates a slope signal having a lump waveform based on the clock signal CLK generated by the oscillator 16. The slope compensation unit 15 combines the thus-generated slope signal and the current detection signal Vcs generated at the CS terminal. The thus-combined slope signal Slp is fed to a PWM comparator 12.

The PWM comparator 12 compares the slope signal Slp and the error signal Verr fed from the error amplifier 11. An output of the PWM comparator 12 is used to control the duty of switching of the switching transistor M1.

On the basis of both the output of the PWM comparator 12 and the clock signal CLK, the logic unit 19 controls the switching of the switching transistor M1 via a driver 20. The driver 20 switches between High level of the OUTH terminal and Low level of the OUTL terminal, thereby performing the switching of the switching transistor M1.

Moreover, the logic unit 19 receives various protection signals and controls the operations of various kinds of protection functions. Furthermore, the logic unit 19 outputs a signal RESET that turns on NMOS transistors 10 and 13, which, in turn, respectively discharges the capacitors Css and Ccp.

A gate controller 21 which controls a gate of the protection transistor M2 includes a PMOS transistor 21A and a constant current source 21B. A source of the PMOS transistor 21A is connected to the VCC terminal, and a drain thereof is connected to the SD terminal. In relation to the gate controller 21, a resistor Rsd, capacitor Csd, and Zener diode Dsd are disposed outside the semiconductor device 1. The resistor Rsd, capacitor Csd, and Zener diode Dsd are disposed in parallel between the VCC terminal and the SD terminal.

At startup, after the release of UVLO, the constant current source 21B draws a current from the SD terminal to turn on the protection transistor M2. A short circuit between the drain and source of the switching transistor M1 is detected, and thus, the signal Scp is asserted, which causes the logic unit 19 to turn on the PMOS transistor 21A. This turns the SD terminal to High level, and forcibly turns off the protection transistor M2.

<Terminal Layout of Semiconductor Device>

Figure 2:
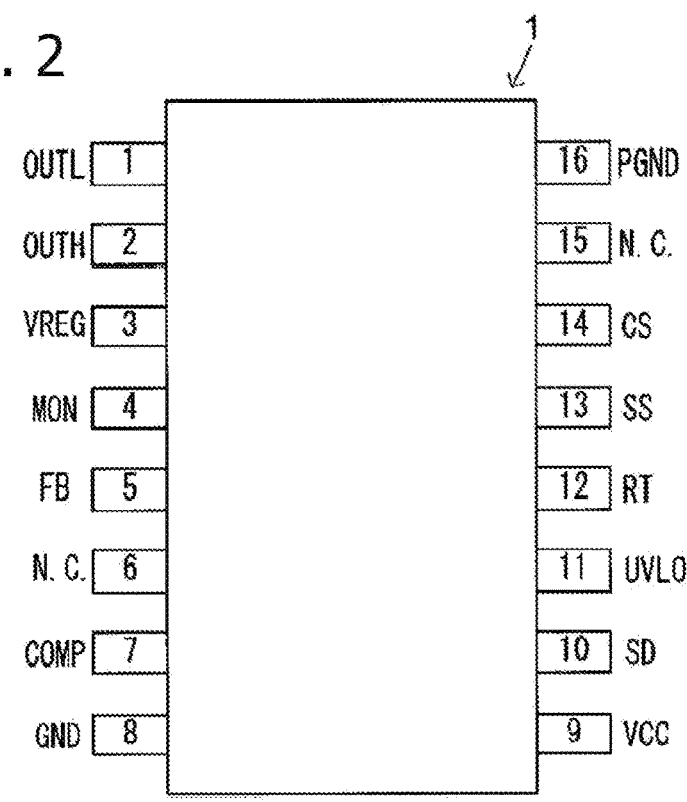
FIG. 2 is a plan view of a semiconductor device according to the embodiment of the present disclosure, viewed from the top.

FIG. 2 is a plan view of the semiconductor device 1 viewed from the top, illustrating the arrangement of terminals (pins) of the semiconductor device 1. In FIG. 2, the X direction and the Y direction are indicated, and these directions are orthogonal to each other.

As depicted in FIG. 2, the semiconductor device 1 is configured to have a small outline package (SOP), as an example of its package configuration, which has a rectangular shape when viewed from the top. The arrangement is as follows: along one side of the rectangular shape extending in the X direction, there are arranged the OUTL terminal (pin 1), OUTH terminal (pin 2), VREG terminal (pin 3), MON terminal (pin 4), FB terminal (pin 5), unconnected terminal (pin 6), COMP terminal (pin 7), and GND terminal (pin 8) in this order. Along the other side facing the above-described one side in the Y direction, there are arranged the VCC terminal (pin 9), SD terminal (pin 10), UVLO terminal (pin 11), RT terminal (pin 12), SS terminal (pin 13), CS terminal (pin 14), unconnected terminal (pin 15), and PGND terminal (pin 16) in this order. Note that the pin 1 faces the pin 16 in the Y direction and then the pin 2 faces the pin 15 in the Y direction. Likewise, each of the remaining pins on the one side faces a corresponding pin on the other side, sequentially in the above-described order of pin number; finally, the pin 8 at the last on the one side faces the pin 9 at the last on the other side in the Y direction. Moreover, the unconnected terminals are ones that are not connected to any internal circuit.

<Configuration of Chipping Detection>

Next, a description will be made regarding a configuration of the chipping detection of chipping in the semiconductor chip that is included in the semiconductor device 1. In the embodiment, the chipping is detected through the use of the soft-start circuit 9, as an example.

Figure 3:
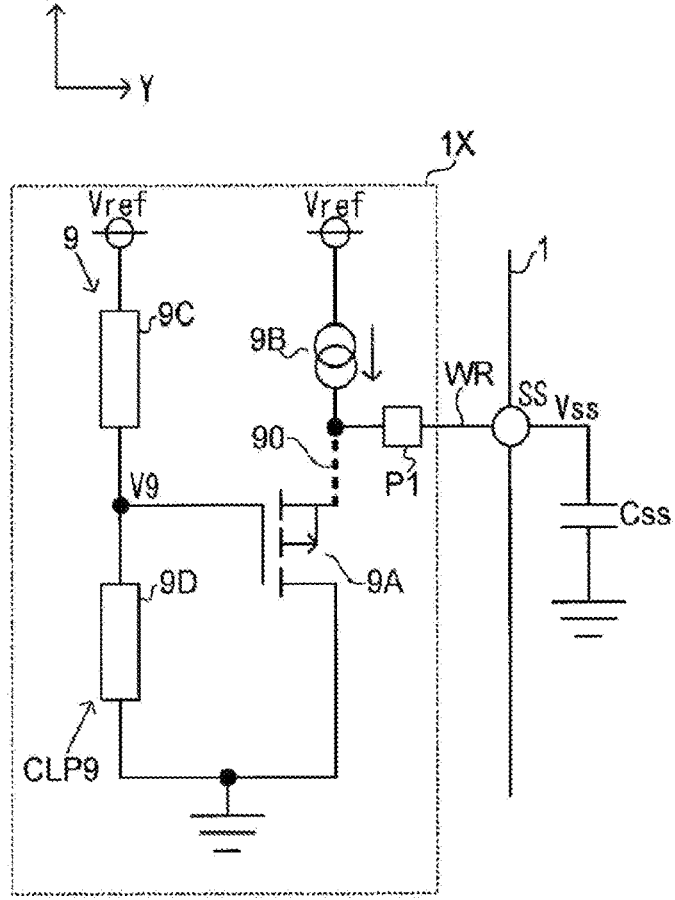
FIG. 3 is a circuit diagram illustrating an example of a configuration of a soft-start circuit.

FIG. 3 is a circuit diagram illustrating one example of a configuration of the soft-start circuit 9. Note that FIG. 3 also illustrates a semiconductor chip 1X included in the semiconductor device 1. The soft-start circuit 9 and a pad P1 are formed in the semiconductor chip 1X.

The soft-start circuit 9 includes a PMOS transistor 9A, constant current source 9B, voltage dividing resistor 9C, and voltage dividing resistor 9D. A source of the PMOS transistor 9A is connected to the pad P1. A drain of the PMOS transistor 9A is connected to an application end of a ground potential. A gate of the PMOS transistor 9A is applied with a voltage V9 that is produced by dividing the reference voltage Vref by the voltage dividing resistors 9C and 9D. The constant current source 9B feeds a current into the pad P1, using the reference voltage Vref as a power source. Note that the PMOS transistor 9A may be replaced with a bipolar transistor.

The pad P1 is connected to the SS terminal (lead terminal of the semiconductor device 1) with a wire WR that is made of Au or any other material, for example. The capacitor Css is externally connected to the SS terminal.

Figure 4:
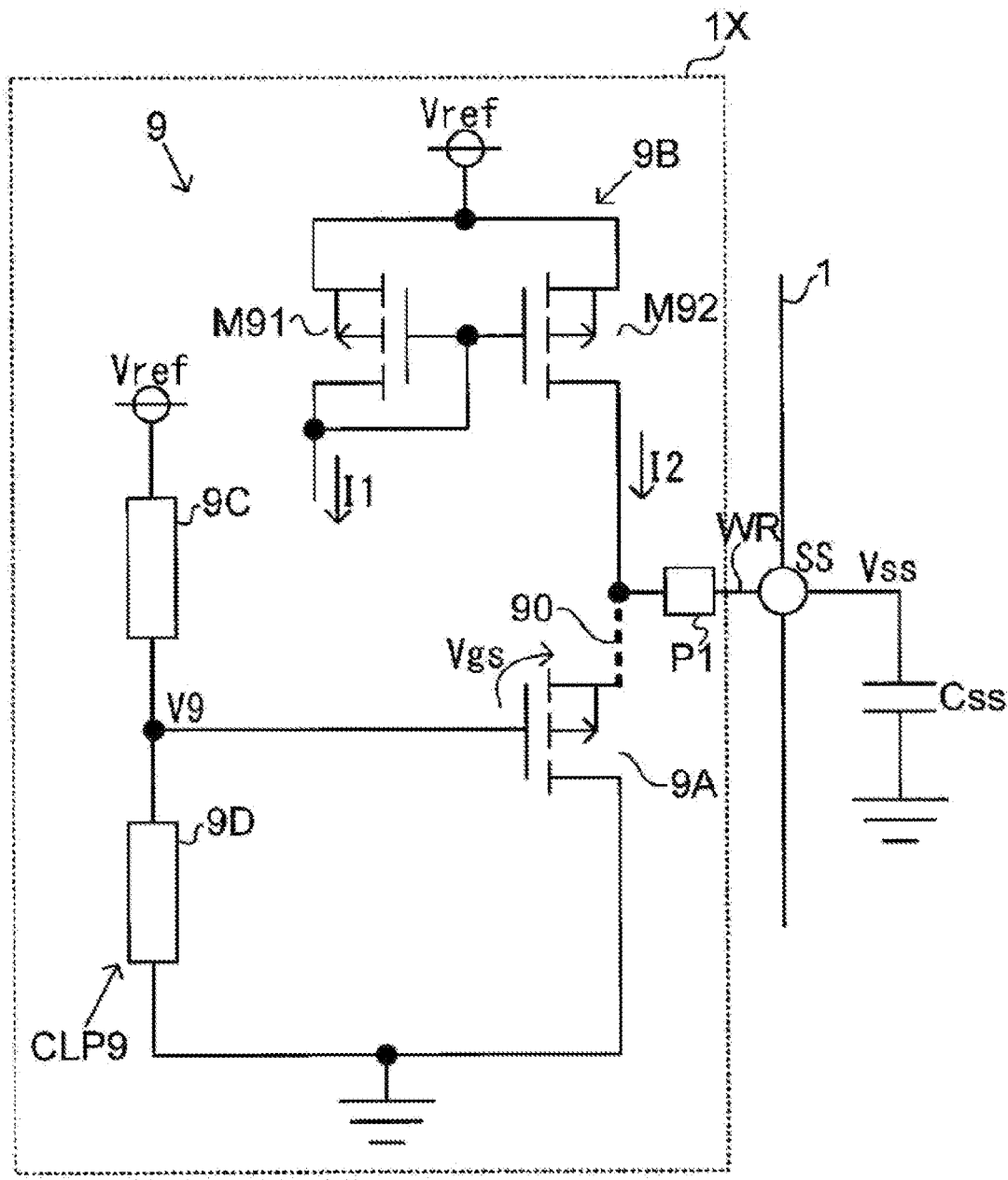
FIG. 4 is a circuit diagram illustrating a more specified example of the circuit of FIG. 3.

FIG. 4 is a circuit diagram illustrating the circuit of FIG. 3, including a more specific illustration of the constant current source 9B. As depicted in FIG. 4, the constant current source 9B includes a current mirror that includes a PMOS transistor M91 and a PMOS transistor M92. According to a reference current I1 flowing in the PMOS transistor M91, a current I2 flows in the PMOS transistor M92, and the current I2 flows into the pad P1.

Figure 6:
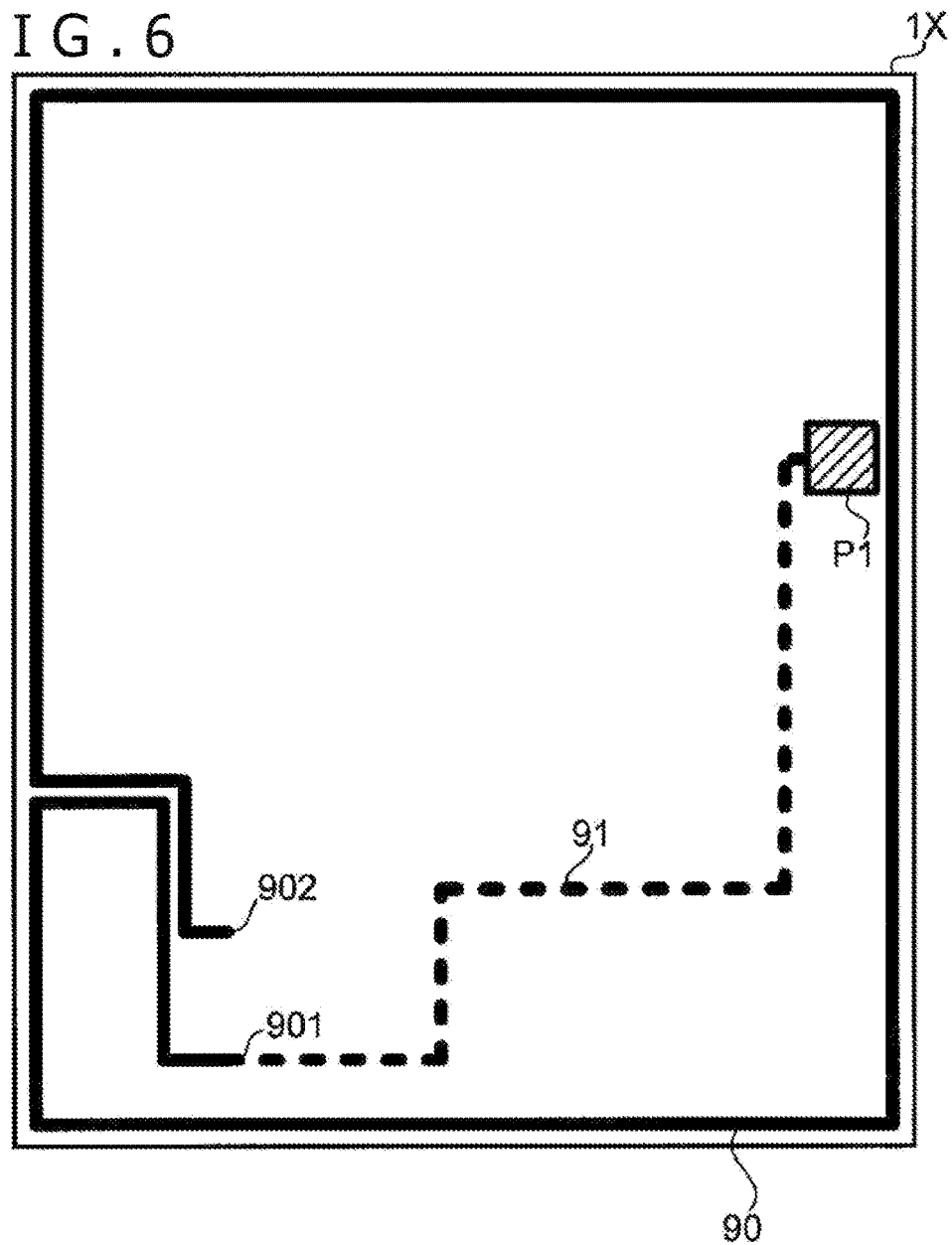
FIG. 6 is a schematic diagram illustrating an example of a layout of wiring for chipping detection.

Here, as depicted in FIGS. 3 and 4, the source of the PMOS transistor 9A is connected to the pad P1 via a wiring 90 (indicated by a broken line). The wiring 90, an example of which is illustrated in FIG. 6 to be described later, is formed in the semiconductor chip 1X, along an outer peripheral portion of the semiconductor chip 1X. Since chipping occurs on an outer peripheral edge surface of the semiconductor chip 1X, the chipping causes the wiring 90 to be broken.

Figure 5:
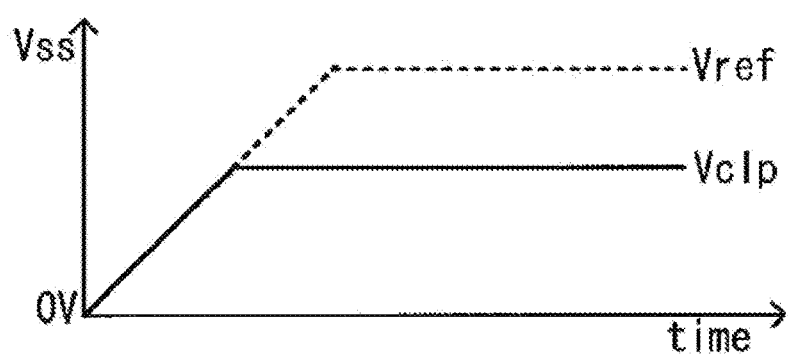
FIG. 5 is a waveform diagram illustrating an example of behavior of a soft-start voltage.

FIG. 5 is a diagram illustrating an example of the waveform of the soft-start voltage Vss generated at the SS terminal. In a case where no chipping occurs in the semiconductor chip 1X and thus, no broken wire occurs in the wiring 90, the waveform is one indicated by a solid line in FIG. 5. That is, the capacitor Css is charged by the current I2 generated by the constant current source 9B, so that the soft-start voltage Vss gradually rises from 0 V. Then, when the soft-start voltage Vss reaches a clamp voltage Vclp that is higher than the voltage V9 by the gate-source voltage Vgs of the PMOS transistor 9A, the charging of the capacitor Css is halted, so that the soft-start voltage Vss becomes constant at the clamp voltage Vclp. That is, the PMOS transistor 9A and the voltage dividing resistors 9C and 9D constitute a voltage clamp unit CLP9 configured to clamp the soft-start voltage Vss.

Meanwhile, in a case where chipping occurs in the semiconductor chip 1X and thus the wiring 90 is broken, the soft-start voltage Vss gradually rises due to the charging of the capacitor Css as depicted in FIG. 5 and behaves as follows: That is, since the charging is still continued even after the soft-start voltage Vss has reached and exceeded the clamp voltage Vclp, the Vss continues to rise until it reaches the reference voltage Vref and remains constant at the reference voltage Vref, as indicated by a broken line in FIG. 5.

In this way, the soft-start voltage Vss is monitored that is generated at the SS terminal of the semiconductor device 1 in which the semiconductor chip 1X is packaged. The monitoring makes it possible to detect the presence or absence of chipping there by determining whether the soft-start voltage Vss has been clamped at the clamp voltage Vclp, serving as High level indicating normal operation, or has been fixed at the reference voltage Vref that exceeds the clamp voltage Vclp. In particular, the SS terminal used for detecting chipping is also used as the terminal needed for an original function of the semiconductor device 1, which eliminates the need for an additional terminal to be used only for inspecting chipping, resulting in no increase in the number of terminals.

FIG. 6 is a schematic diagram illustrating an example of the layout of the wiring 90 in the semiconductor chip 1X. As depicted in FIG. 6, the wiring 90 is formed along substantially the entire outer periphery of the semiconductor chip 1X. A first end 901 of the wiring 90 is connected to a drain of the PMOS transistor M92 (FIG. 4) in the constant current source 9B. A second end 902 of the wiring 90 is connected to the source of the PMOS transistor 9A (FIG. 4) in the voltage clamp unit CLP9. In addition, as depicted in FIG. 6, the first end 901 is connected to the pad P1 via an SS terminal wiring 91.

Figure 7:
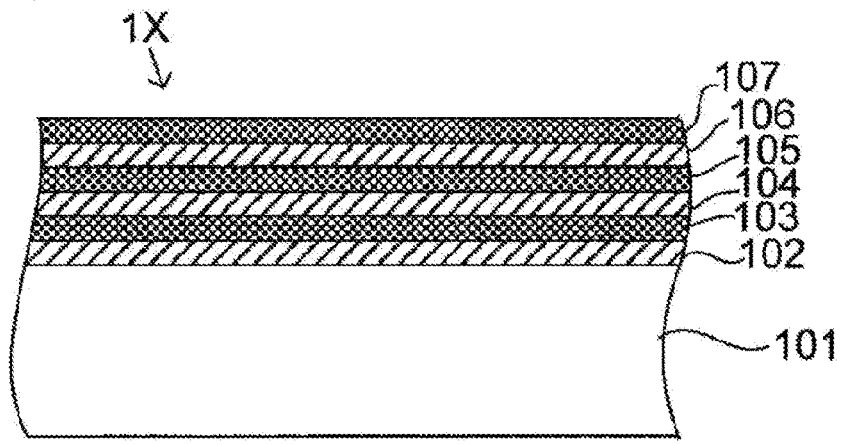
FIG. 7 is a schematic cross-sectional view illustrating an example of a configuration of layers of a semiconductor chip.

Here, FIG. 7 is a schematic cross-sectional view illustrating one example of a configuration of layers of the semiconductor chip 1X. FIG. 7 illustrates one example of the configuration including a plurality of metal layers. In the semiconductor chip 1X depicted in FIG. 7, laminated on a semiconductor substrate 101 are: a first insulating layer 102, first metal layer 103, second insulating layer 104, second metal layer 105, third insulating layer 106, and third metal layer 107 in this order from the semiconductor substrate 101 side.

The wiring 90 for chipping detection described above may be disposed in the third metal layer 107, among the three metal layers, which is the outermost layer located on the opposite side to the semiconductor substrate 101. In this case, unfortunately, a pad is disposed in the third metal layer 107 such that the pad can be connected to an electrostatic discharge (ESD) countermeasure element which is disposed along the vicinity of the outer periphery of the semiconductor chip 1X. Therefore, the wiring 90 is required to be formed on a peripheral location outer than the pad. Moreover, the wiring in the third metal layer 107 is required to have a large width, resulting in a possible increase in size of the semiconductor chip 1X. As a countermeasure to this, for example, the wiring 90 may be disposed in any one of the second metal layer 105 and the first metal layer 103, which both are the metal layers other than the third metal layer 107, resulting in preventing increase in chip size. Note that the wiring 90 can also be formed in both of the second metal layer 105 and the first metal layer 103, via interconnection by means of a contact hole.

Note that, for more reliable detection of chipping, the wiring 90 may also be formed in all of the third metal layer 107, second metal layer 105, and first metal layer 103, via interconnection by means of contact holes.

Figure 8:
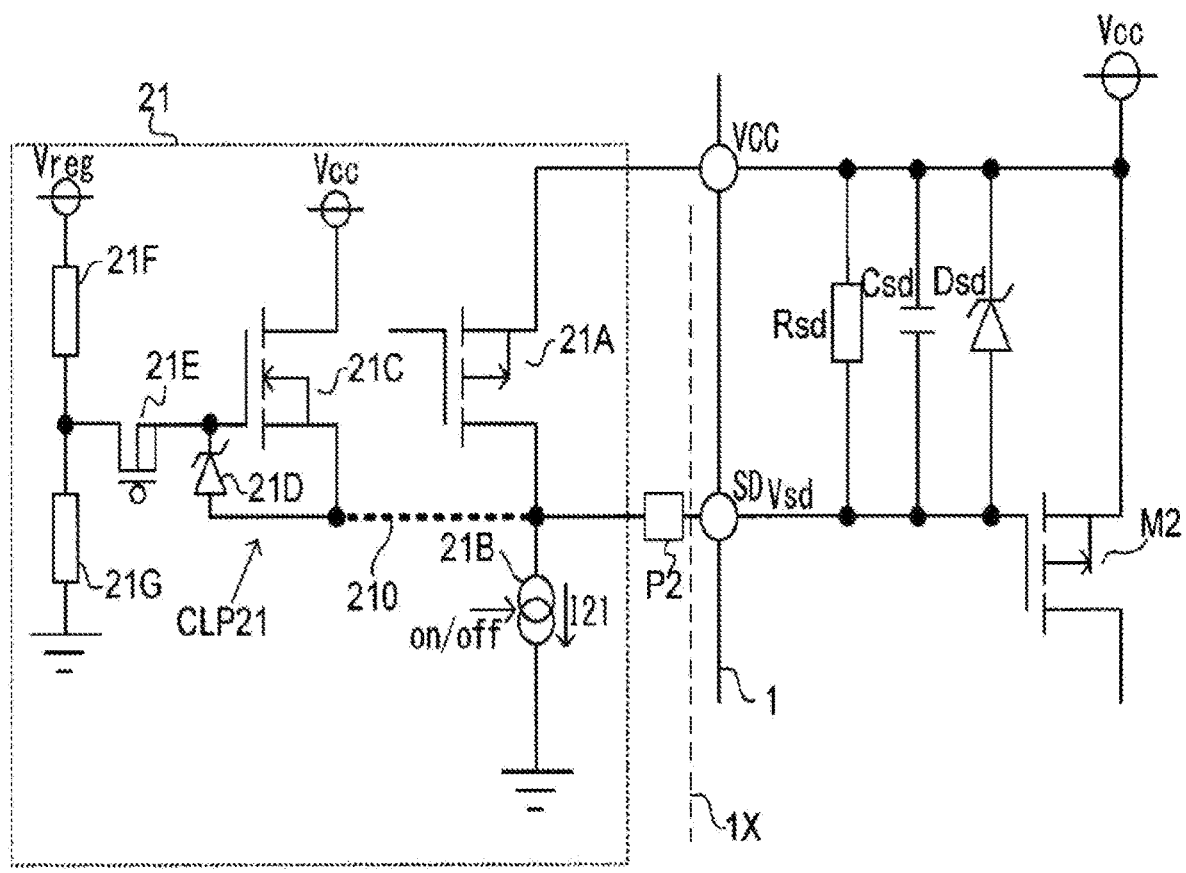
FIG. 8 is a circuit diagram illustrating an example of a configuration of a gate controller.

Furthermore, the configuration of detecting chipping is not limited to the aforementioned one using the soft-start circuit. For example, the configuration may be one using the gate controller 21 that controls the gate of the protection transistor M2. FIG. 8 is a circuit diagram illustrating one example of the configuration of the gate controller 21. Note that FIG. 8 also illustrates the semiconductor chip 1X, resistor Rsd, capacitor Csd, Zener diode Dsd, and protection transistor M2.

As depicted in FIG. 8, a drain of the PMOS transistor 21A included in the gate controller 21 is connected to the SD terminal of the semiconductor device 1 via a pad P2 of the semiconductor chip 1X.

Moreover, as depicted in FIG. 8, the gate controller 21 includes a voltage clamp unit CLP21. The voltage clamp unit CLP21 includes an NMOS transistor 21C, a Zener diode 21D, a PMOS transistor 21E, and voltage dividing resistors 21F and 21G.

The drain of the PMOS transistor 21A is connected to a source of the NMOS transistor 21C via a wiring 210 (indicated by a broken line in FIG. 8). The wiring 210 is formed, for chipping detection, along the outer periphery of the semiconductor chip 1X in the same manner as for the wiring 90 described above. To a drain of the NMOS transistor 21C, an application end of the power supply voltage Vcc is connected. A cathode of the Zener diode 21D for breakdown voltage protection is connected to a gate of the NMOS transistor 21C. An anode of the Zener diode 21D is connected to a source of the NMOS transistor 21C. A source of the PMOS transistor 21E is connected to the gate of the NMOS transistor 21C. A drain of the PMOS transistor 21E is connected to a node at which the voltage dividing resistors 21F and 21G for dividing the internal voltage Vreg are connected to each other. A gate of the PMOS transistor 21E is open. This allows a body diode of the PMOS transistor 21E to be used for reverse current protection. Note that a drain of the PMOS transistor 21E may be connected to an application end of the reference voltage Vref.

In a case where no chipping has occurred in the semiconductor chip 1X and thus the wiring 210 is not broken, when the constant current source 21B is turned on at startup, a current is drawn thereinto from the SD terminal via the pad P2. This causes the voltage Vsd of the SD terminal to be clamped to a clamp voltage that is lower, by the Vgs of the NMOS transistor 21C, than the voltage obtained by dividing the internal voltage Vreg.

In contrast, in a case where chipping has occurred in the semiconductor chip 1X and thus the wiring 210 is broken, when the constant current source 21B is turned on at startup, the voltage Vsd of the SD terminal becomes a voltage lower than the power supply voltage Vcc by the amount of a voltage drop=Rsd×I21 (I21: constant current value), and thus such voltage Vsd becomes lower than the clamp voltage described above.

In this way, the voltage Vsd is monitored that is generated at the SD terminal of the semiconductor device 1 in which the semiconductor chip 1X is packaged. The monitoring makes it possible to detect the presence or absence of chipping by determining whether the voltage Vsd has been clamped at the clamp voltage, serving as Low level indicating normal operation, or has been fixed at the voltage lower than the clamp voltage. In particular, the SD terminal used for detecting chipping is also used as the terminal needed for an original function of the semiconductor device 1, which eliminates the need for an additional terminal to be used only for inspecting chipping, resulting in no increase in the number of terminals.

OTHER VARIATIONS

Note that the embodiments described above are merely examples in every aspect and should not be understood as limitations. The technical scope of the present disclosure is defined not by the above description of the embodiments but by the claims, and should be understood to include all modifications within meanings and scopes equivalent to the claims.

The present disclosure is applicable to power supply ICs for use in vehicles, for example.

What is claimed is:

1. An semiconductor device configured by packaging a semiconductor chip, comprising:
    at least one terminal,
    the semiconductor chip includes:
        a pad connected to the at least one terminal,
        a voltage clamp unit, and
        a wiring disposed along an outer periphery of the semiconductor chip and between the voltage clamp unit and the pad,
    wherein, the voltage clamp unit includes a first p-channel transistor having a source connected to the pad via the wiring, and voltage dividing resistors configured to divide a reference voltage into a sub-voltage applied to a gate of the first p-channel transistor,
    wherein, in a case in which the wiring has no broken wire portion, a terminal voltage generated at the terminal is clamped to a clamp voltage by the voltage clamp unit, and
    in a case in which the wiring has a broken wire portion, the terminal voltage reaches a predetermined voltage higher than the clamp voltage or a predetermined voltage lower than the clamp voltage.

2. The semiconductor device according to claim 1,
    wherein the terminal is connectable to an external capacitor, and
    the semiconductor chip includes a constant current source configured to cause a current to flow into the pad.

3. The semiconductor device according to claim 2, wherein the constant current source is a current mirror which uses a reference voltage as a power source and includes a second p-channel transistor and a third p-channel transistor.

4. The semiconductor device according to claim 2, wherein the terminal voltage is a voltage to be used in a soft start operation fed to an error amplifier included in the semiconductor chip.

5. The semiconductor device according to claim 1,
    wherein the semiconductor chip includes a semiconductor substrate, and a plurality of metal layers disposed on the semiconductor substrate, and
    the wiring is formed in at least one of the plurality of metal layers other than the outermost metal layer on an opposite side to a side of the semiconductor substrate, among the plurality of metal layers.

6. The semiconductor device according to claim 1,
    wherein the semiconductor chip includes a semiconductor substrate, and a plurality of metal layers disposed on the semiconductor substrate, and
    the wiring is formed in all of the plurality of metal layers.

7. The semiconductor device according to claim 1, wherein the semiconductor device is a power-supply controller configured to drive and control a switching power-supply circuit.

8. The semiconductor device according to claim 7, being for use in a vehicle.

9. A switching power-supply circuit comprising:
    a semiconductor device according to claim 7.

10. A switching power-supply circuit comprising:
    a semiconductor device according to claim 8.

* * * * *